US011255889B2

(12) United States Patent
Spevak

(10) Patent No.: US 11,255,889 B2
(45) Date of Patent: Feb. 22, 2022

(54) DIRECT CAPACITANCE MEASUREMENT BASED CAPACITIVE DISTURBANCE DETECTION SYSTEM

(71) Applicant: TEXAS INSTRUMENTS INCORPORATED, Dallas, TX (US)

(72) Inventor: Peter Spevak, Moosburg an der Isar (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/752,792

(22) Filed: Jan. 27, 2020

(65) Prior Publication Data

US 2021/0072298 A1   Mar. 11, 2021

Related U.S. Application Data

(60) Provisional application No. 62/896,188, filed on Sep. 5, 2019, provisional application No. 62/950,563, filed on Dec. 19, 2019.

(51) Int. Cl.
| | |
|---|---|
| *G01R 27/26* | (2006.01) |
| *H03B 28/00* | (2006.01) |
| *G06F 3/044* | (2006.01) |
| *G06F 3/041* | (2006.01) |

(52) U.S. Cl.
CPC ......... *G01R 27/2605* (2013.01); *G06F 3/044* (2013.01); *G06F 3/0412* (2013.01); *H03B 28/00* (2013.01)

(58) Field of Classification Search
CPC ...... G06F 3/041; G06F 3/0412; G06F 3/0414; G06F 3/044; G06F 3/047; H03B 25/00; H03B 28/00; H03B 2200/003; H03B 2200/0034
USPC .................................................. 345/173–179
See application file for complete search history.

(56) References Cited

U.S. PATENT DOCUMENTS

| | | | | |
|---|---|---|---|---|
| 3,865,977 | A * | 2/1975 | Hiraki ................... | G06F 3/0441 178/20.04 |
| 4,103,252 | A * | 7/1978 | Bobick ................. | H03K 17/962 331/48 |
| 5,369,227 | A * | 11/1994 | Stone ................... | G06F 3/03545 172/19 |

(Continued)

*Primary Examiner* — Alexander Eisen
*Assistant Examiner* — Nelson Lam
(74) *Attorney, Agent, or Firm* — Ebby Abraham; Charles A. Brill; Frank D. Cimino

(57) ABSTRACT

An apparatus includes a first oscillator circuit coupled to a first electrode and a second oscillator circuit coupled to a second electrode. The first and second oscillator circuits oscillate synchronously in response to a capacitance between the first and second electrodes being greater than or equal to a threshold coupling capacitance and asynchronously in response to the capacitance being less than the threshold coupling capacitance. The first and second electrodes are separated by a distance, such that a disturbance within the distance increases the capacitance between the electrodes equal to or above the threshold coupling capacitance. The frequency of the first oscillator circuit is inversely proportional to a capacitance of the first electrode, and the frequency of the second oscillator circuit is inversely proportional to a capacitance of the second electrode.

24 Claims, 5 Drawing Sheets

(56) References Cited

U.S. PATENT DOCUMENTS

| | | | | |
|---|---|---|---|---|
| 5,790,107 | A * | 8/1998 | Kasser | G01R 27/2605 |
| | | | | 345/174 |
| 5,796,355 | A * | 8/1998 | Smigelski | H03K 17/962 |
| | | | | 341/33 |
| 7,307,485 | B1 * | 12/2007 | Snyder | G01R 27/2605 |
| | | | | 324/548 |
| 8,159,462 | B1 * | 4/2012 | Seguine | G06F 3/0446 |
| | | | | 345/173 |
| 2003/0028346 | A1 * | 2/2003 | Sinclair | G06F 3/044 |
| | | | | 702/150 |
| 2005/0062732 | A1 * | 3/2005 | Sinclair | G06F 3/03547 |
| | | | | 345/184 |
| 2005/0109125 | A1 * | 5/2005 | Hall | G06F 3/044 |
| | | | | 73/862.68 |
| 2007/0171211 | A1 * | 7/2007 | Perski | G06F 3/041 |
| | | | | 345/173 |
| 2011/0025479 | A1 * | 2/2011 | Hwang | B06B 1/0207 |
| | | | | 340/407.1 |
| 2011/0074445 | A1 * | 3/2011 | Nascimento | G01D 5/24 |
| | | | | 324/676 |
| 2012/0062500 | A1 * | 3/2012 | Miller | G06F 3/04166 |
| | | | | 345/174 |
| 2014/0354582 | A1 * | 12/2014 | Horne | G06F 3/044 |
| | | | | 345/174 |

* cited by examiner

DIRECT CAPACITANCE MEASUREMENT BASED CAPACITIVE DISTURBANCE DETECTION SYSTEM

CROSS-REFERENCE TO RELATED APPLICATIONS

This application claims priority to U.S. Provisional Application 62/896,188, filed Sep. 5, 2019, and U.S. Provisional Application 62/950,563, filed Dec. 19, 2019, which are incorporated herein in their entirety.

BACKGROUND

Many capacitive sensing systems do not directly measure capacitance and instead indirectly determine capacitance based on measured changes in the charge on electrodes. However, the electric field and relative charge of electrodes can be influenced by interfering electric fields, stress on the electrodes, touch or other disturbances, temperature, humidity, and the like, and these types of capacitive sensing systems may not distinguish between environmental and capacitive changes to the charge on the electrodes. Further, a capacitive sensing system will not recognize any change in capacitance if the electrodes carry the same electric potential.

Measurement of charge on electrodes rather than capacitance forces the capacitive sensing system to calculate long term and short term averages in order to differentiate between fast and slow changes in the charge on the electrodes. Fast changes in the charge on the electrodes may result from a disturbance of the capacitive sensing system. Slow changes in the charge on the electrodes may result from a change in capacitance or from a change in environmental conditions such as temperature or humidity. The ongoing calculations and comparisons to a predetermined threshold are computationally expensive and increase the amount of necessary code to filter out disturbances to the capacitive sensing system.

SUMMARY

An apparatus comprises a first oscillator circuit coupled to a first electrode and a second oscillator circuit coupled to a second electrode. The oscillator circuits oscillate synchronously in response to a capacitance between the first and second electrodes being greater than a threshold coupling capacitance, and asynchronously in response to the capacitance being less than the threshold coupling capacitance. In some implementations, a capacitive sensing circuit is coupled to the first and second oscillator circuits and determines a capacitance of the first electrode based on a frequency of the first oscillator circuit and a capacitance of the second electrode based on a frequency of the second oscillator circuit.

The capacitive sensing circuit can also determine whether the capacitance between the first and second electrodes is greater than the threshold coupling capacitance based on whether the first and second oscillator circuits oscillate synchronously or asynchronously. In some implementations, the apparatus also comprises a capacitor coupled to the first and second electrodes and has a capacitance less than the threshold coupling capacitance. In some implementations, the first and second electrodes are separated by a distance, such that a disturbance within the distance increases the capacitance between the first and second electrodes above the threshold coupling capacitance.

BRIEF DESCRIPTION OF THE DRAWINGS

For a detailed description of various examples, reference will now be made to the accompanying drawings in which.

DETAILED DESCRIPTION

Figure 1:
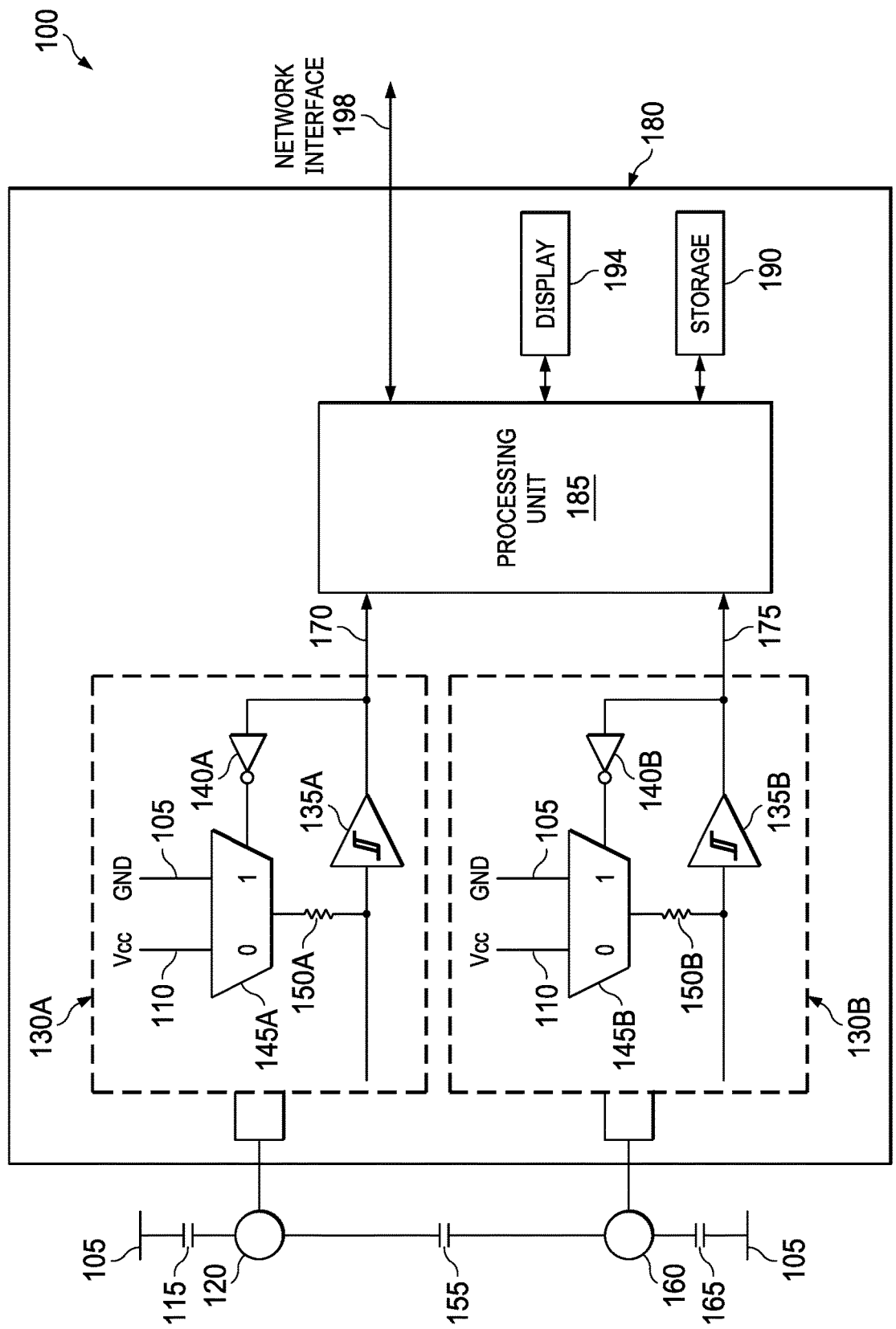
FIG. 1 illustrates an example capacitive disturbance detection system.

The disclosed capacitive disturbance detection systems directly measure capacitance, rather than charge on electrodes, and are robust against interfering electric fields, stress on the electrodes, temperature, humidity, and the like. The disclosed capacitive disturbance detection systems include a first electrode and a second electrode coupled together by a capacitor, a first relaxation oscillator circuit coupled to the first electrode, and a second relaxation oscillator circuit coupled to the second electrode. The first and second relaxation oscillator circuits are nonlinear oscillator circuits that charge a capacitor or inductor to a threshold level, then discharge it, generating a discontinuously changing waveform such as a triangle wave. The oscillation frequency depends on the time constant of the capacitor or inductor included in the relaxation oscillator circuit. The oscillation frequency of the first relaxation oscillator circuit is based on a capacitance at the first electrode, and the oscillation frequency of the second relaxation oscillator circuit is based on a capacitance at the second electrode.

In response to the capacitance between the first and the second electrodes being greater than or equal to a threshold coupling capacitance, the first and the second electrodes are effectively coupled together such that the oscillation frequencies of the first and the second relaxation oscillators are based on the capacitances of both the first and the second electrodes. The first and the second relaxation oscillator circuits are configured to oscillate synchronously in response to a capacitance between the first and the second electrodes being above a threshold capacitance for coupling the first and the second electrodes, and to oscillate asynchronously in response to the capacitance between the first and the second electrodes being less than the threshold capacitance.

The synchronous or asynchronous operation of the first and the second relaxation oscillator circuits may be used to determine whether the capacitance between the first and the second electrodes is greater than or equal to the threshold coupling capacitance, which in some implementations indicates the presence of an external influence that increases or decreases the capacitance between the first and the second electrodes. For example in a touch-based interface implementing the disclosed capacitive disturbance detection system, a touch between the first and the second electrodes increases the capacitance between the first and the second electrodes above the threshold coupling capacitance, such that the first and the second relaxation oscillator circuits oscillate synchronously.

A capacitive sensing circuit including the first and the second relaxation oscillator circuits is configured to determine a capacitance of the first electrode based on an oscillation frequency of the first relaxation oscillator circuit and a capacitance of the second electrode based on an oscillation frequency of the second relaxation oscillator circuit. The capacitive sensing circuit can also be configured to determine whether the first and the second relaxation oscillator circuits oscillate synchronously, which indicates the capacitance between the first and the second electrodes is greater than or equal to the threshold coupling capacitance, or asynchronously, which indicates the capacitance is less than the threshold coupling capacitance. In some implementations, the first and the second relaxation oscillator circuits oscillate synchronously in response to the presence of an external influence that increases the capacitance between the first and the second electrodes, such as in a touch-based interface implementing the disclosed capacitive disturbance detection system.

In some implementations, the first and the second relaxation oscillator circuits oscillate asynchronously in response to the absence of an external influence that increases the capacitance between the first and the second electrodes, such as in a security system implementing the disclosed capacitive disturbance detection system. For example, a door latch includes the first and the second electrodes, and a door handle includes a conductive element that increases the capacitance between the first and the second electrodes above the threshold coupling capacitance, such that the first and the second relaxation oscillator circuits oscillate synchronously while the door is closed. In response to the door opening, the conductive element in the door handle is removed, and the capacitance between the first and the second electrodes decreases below the threshold coupling capacitance, such that the first and the second relaxation oscillator circuits oscillate asynchronously. The security system can determine whether the door is open or closed based on whether the first and the second relaxation oscillator circuits oscillate asynchronously or synchronously.

FIG. 1 illustrates an example capacitive disturbance detection system 100. Disturbance detection system 100 includes two capacitive electrodes 120 and 160 and a capacitive sensing circuit 180 comprising two relaxation oscillators 130A and 130B. Capacitive electrode 120 has a capacitance 115 relative to ground 105, and capacitive electrode 160 has a capacitance 165 relative to ground 105. Capacitive electrodes 120 and 160 are coupled together by a capacitor 155, which has a capacitance insufficient to cause relaxation oscillators 130A and 130B to oscillate synchronously. In some embodiments, capacitor 155 represents the stray capacitance between capacitive electrodes 120 and 160.

In some embodiments, capacitor 155 represents a discrete capacitor between capacitive electrodes 120 and 160 with a capacitance less than a threshold coupling capacitance for capacitive electrodes 120 and 160 but large enough that an increase in capacitance due to a disturbance such as a touch in between capacitive electrodes 120 and 160 increases the capacitance between capacitive electrodes 120 and 160 above the threshold coupling capacitance. The distance between capacitive electrodes 120 and 160 is chosen such that a capacitive disturbance in the space between them increases the capacitance 155 above the threshold coupling capacitance and relaxation oscillators 130A and 130B oscillate synchronously. Capacitive disturbance detection system 100 includes two capacitive electrodes and two relaxation oscillators, but any appropriate number of electrodes and relaxation oscillators may be used instead.

Relaxation oscillators 130A and 130B are substantially the same, and in this example are shown as Schmitt trigger-based relaxation oscillators. Each relaxation oscillator 130 includes a Schmitt trigger or hysteresis buffer 135, an inverter 140, a selector logic circuit 145, and a resistor 150. The input of hysteresis buffer 135 is coupled to the corresponding capacitive electrode 120 or 160, respectively. Inverter 140 is coupled to the output of the hysteresis buffer 135 and outputs a control signal for selector logic circuit 145 which couples resistor 150 to a supply voltage 110 or to ground node 105 based on the control signal from inverter 140. Resistor 150 is further coupled to the input of hysteresis buffer 135. The output 170 of oscillator 130A and the output 175 of oscillator 130B are provided to a processing unit 185, which determines a capacitance for each electrode 120 and 160 based on the frequency of relaxation oscillators 130A and 130B, respectively.

Processing unit 185 detects a capacitive disturbance at electrodes 120 and/or 160 based on changes in the frequencies of relaxation oscillators 130A and 130B. For example, in a touch-based interface implementation, processing unit 185 detects a disturbance or touch at electrodes 120 and/or 160 in response to relaxation oscillators 130A and 130B operating synchronously where previously they had operated asynchronously. As another example, in a security system implementation, processing unit 185 detects the opening of a door or window at electrodes 120 and/or 160 in response to relaxation oscillators 130A and 130B operating asynchronously where previously they had operated synchronously.

Processing unit 185 includes one or more processor units and can store data in storage 190, display a notification regarding the determined capacitance on display 194, or provide the notification to other systems via network interface 198 as appropriate. Storage 190 can be used to store instructions and data received from processing unit 185, and may be any appropriate non-transitory storage medium, such as a static random access memory (SRAM). Network 198 may include various combinations of local area networks (LANs), wide area networks (WANs), the internet, and/or other known or later developed wired or wireless communication mechanisms, for example.

Figure 2:
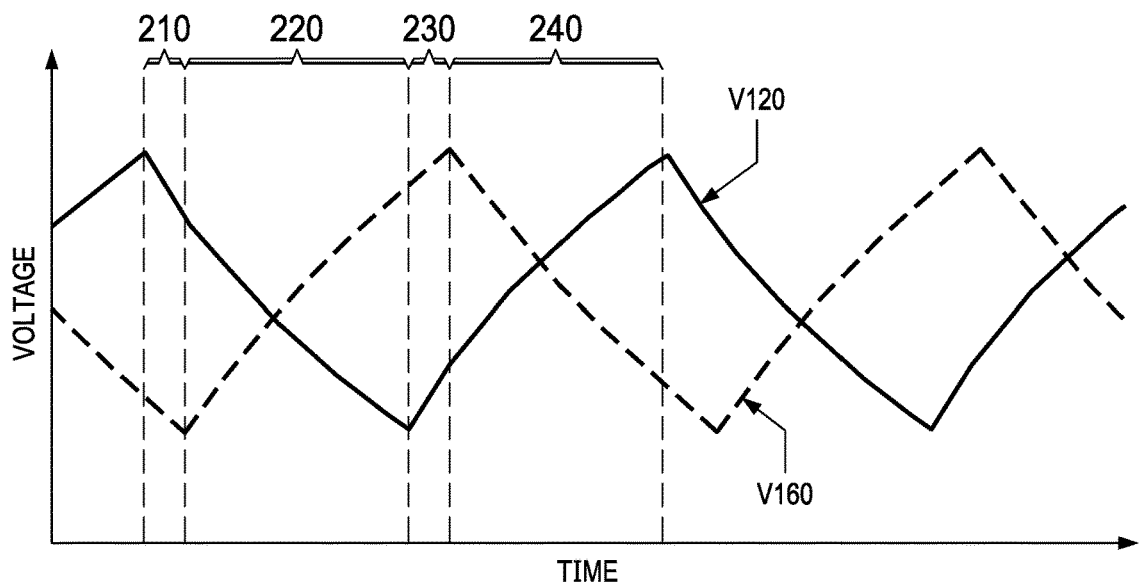
FIG. 2 shows a graph of the voltages at capacitive electrodes in the example capacitive disturbance detection system shown in FIG. 1.

FIG. 2 illustrates a graph of the voltages at capacitive electrodes 120 and 160 relative to ground 105. A disturbance increases the mutual capacitance 155 between electrodes 120 and 160 above a threshold coupling capacitance, coupling electrodes 120 and 160 together, and causes relaxation oscillators 130A and 130B to operate synchronously, at a same frequency. Table 1 illustrates the discharging or recharging of capacitors 115 and 165 and the corresponding changes in voltage V120 at capacitive electrode 120 and voltage V160 at capacitive electrode 160.

TABLE 1

| Time Period | Capacitance 115 | V120 | Capacitance 165 | V160 |
| --- | --- | --- | --- | --- |
| 210 | Discharging faster | Decreasing faster | Discharging faster | Decreasing faster |
| 220 | Discharging slower | Decreasing slower | Recharging slower | Increasing slower |

TABLE 1-continued

| Time Period | Capacitance 115 | V120 | Capacitance 165 | V160 |
|---|---|---|---|---|
| 230 | Recharging faster | Increasing faster | Recharging faster | Increasing faster |
| 240 | Recharging slower | Increasing slower | Discharging slower | Decreasing slower |

During time period 210, the voltages at capacitive electrodes 120 and 160 are both decreasing, which is indicative that capacitors 115 and 165 are being discharged. The voltage V120 at capacitive electrode 120 has just begun to decrease from the positive Schmitt trigger threshold, and the voltage V160 at capacitive electrode 160 has already decreased to nearly the negative Schmitt trigger threshold. The lower voltage V160 and the decreased capacitance 165 of electrode 160 cause the higher capacitance 115 of electrode 120 to discharge faster than it would when electrodes 120 and 160 are not capacitively coupled.

During time period 220, V160 increases from the negative Schmitt trigger threshold as the capacitance 165 of electrode 160 is charged. The increasing charge at electrode 160 slows the decrease in V120 and the corresponding discharge of capacitance 115 at electrode 120, which also slows the recharging of capacitance 165 of electrode 160. During time period 230, V120 and V160 are both increasing as both capacitance 115 of electrode 120 and capacitance 165 of electrode 160 are recharged. Because capacitance 165 is no longer used to slow the discharge of capacitance 115, capacitance 165 recharges faster. During time period 240, V160 decreases from the positive Schmitt trigger threshold as the capacitance 165 of electrode 160 is discharged. The increasing V120 from capacitance 115 of electrode 120 being recharged slows the decrease in V160 due to capacitance 165 at electrode 160 discharging, which also slows the recharging of capacitance 115 of electrode 120.

Figure 3A:
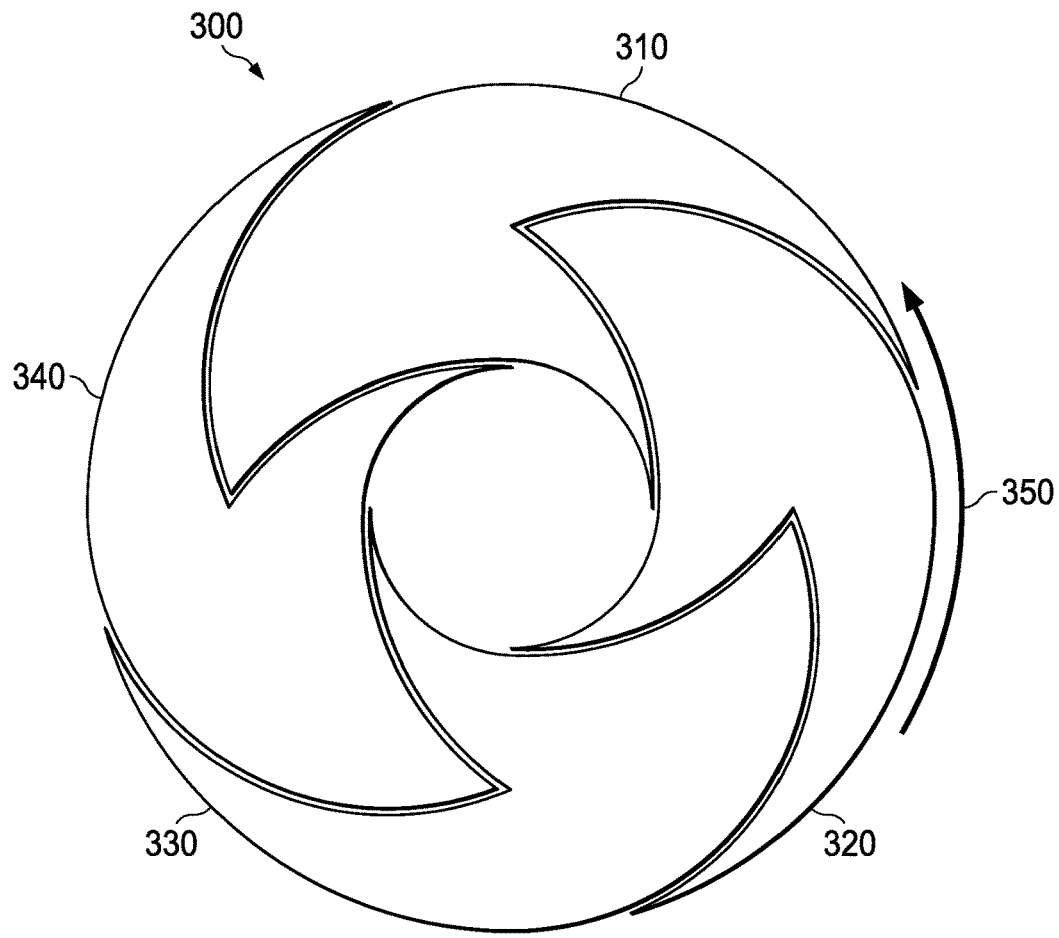
FIGS. 3A-B show an example touch-based interface implementing a capacitive disturbance detection system and a graph of the changes in capacitance measurement results as a touch is applied.
Figure 3B:
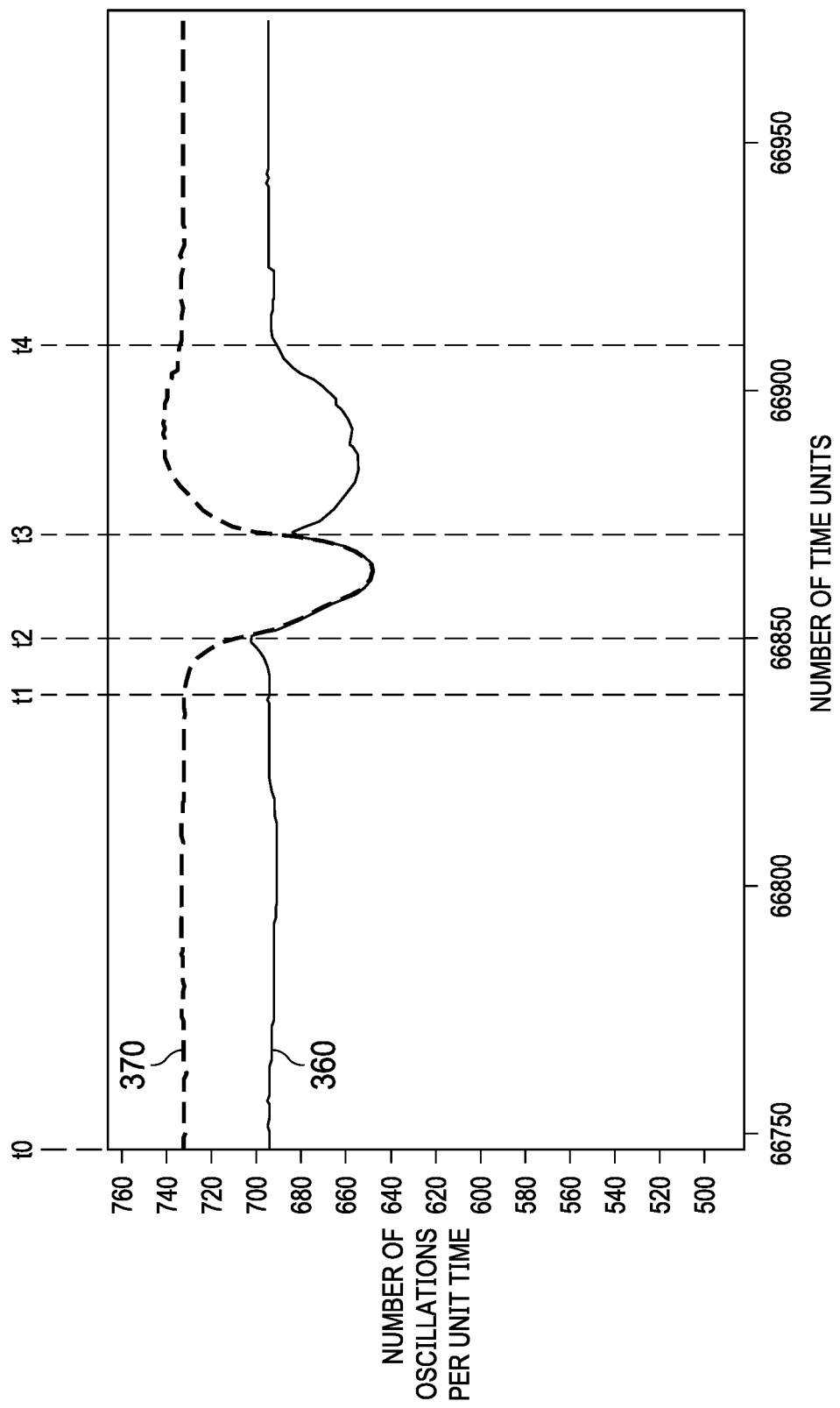

FIGS. 3A-B show an example implementation for a capacitive disturbance detection system such as the one shown in FIG. 1 as a touch-based interface 300 and a graph showing the corresponding change in capacitance as a touch is applied. FIG. 3A shows touch-based interface 300 shaped as a wheel with four capacitive electrodes 310-340 placed along the top, bottom, right, and left sides of interface 300. Arrow 350 indicates the movement of a touch from interlocking electrodes 330 and 320 in the bottom right quarter of interface 300 to interlocking electrodes 320 and 310 in the top right quarter of interface 300.

FIG. 3B shows a graph of the number of oscillations per unit of time over a period of time for the relaxation oscillator circuits coupled to electrodes 310 and 320, illustrating the change in capacitance as indicated by changes in the oscillation frequencies as the touch travels along the path 350. Line 360 corresponds to the number of oscillations per unit of time for the relaxation oscillator circuit coupled to electrode 320, and line 370 corresponds to the number of oscillations per unit of time for the relaxation oscillator circuit coupled to electrode 310.

At time t0, the touch bridges the gap between electrodes 320 and 330, too far from electrode 310 to influence the capacitance. As may be seen from the lines 360 and 370 at time t0, the relaxation oscillator circuits associated with electrodes 310 and 320 are configured to oscillate at different frequencies while the capacitance between electrodes 310 and 320 is less than a threshold coupling capacitance. The two oscillator circuits operate asynchronously until time t1, at which point the touch begins to move counterclockwise, touching only electrode 320 and moving towards electrode 310. The capacitance at electrode 310 increases as the touch moves toward electrode 310, causing the corresponding oscillator frequency to decrease. The touch increases the capacitance between electrodes 310 and 320 above the threshold coupling capacitance, such that the difference in oscillation frequencies for the oscillators coupled to electrodes 310 and 320 decreases.

At time t2, the capacitance between electrodes 310 and 320 reaches the threshold coupling capacitance and the oscillators operate synchronously, illustrated by the overlap of lines 360 and 370. As the touch continues along path 350, the coupling capacitance continues to increase above the threshold coupling capacitance. The capacitance at electrode 310 increases and the capacitance at electrode 320 decreases as the touch moves from electrode 320 towards electrode 310, but the increased capacitance between electrodes 310 and 320 caused by the touch is sufficient to keep the oscillators oscillating synchronously.

At time t3, the touch is too far from the center of electrode 320 to capacitively couple electrodes 310 and 320, such that the coupling capacitance decreases below the threshold coupling capacitance and is insufficient to compensate for native differences in the oscillation frequencies of the two oscillators with the given capacitive loading. The relaxation oscillators stop operating synchronously, illustrated by the divergence of lines 360 and 370. The minimum in line 360 between t3 and t4 indicate the largest capacitance at electrode 310, such as when the touch is directly over electrode 310. Line 360 increases and the capacitance at electrode 310 decreases as the touch moves away from electrode 310. At time t4, the touch is removed or too far from electrodes 310 and 320 to influence their capacitances, which return to their prior, no-touch values, and the oscillators return to their idle state oscillation frequencies.

Figure 4A:
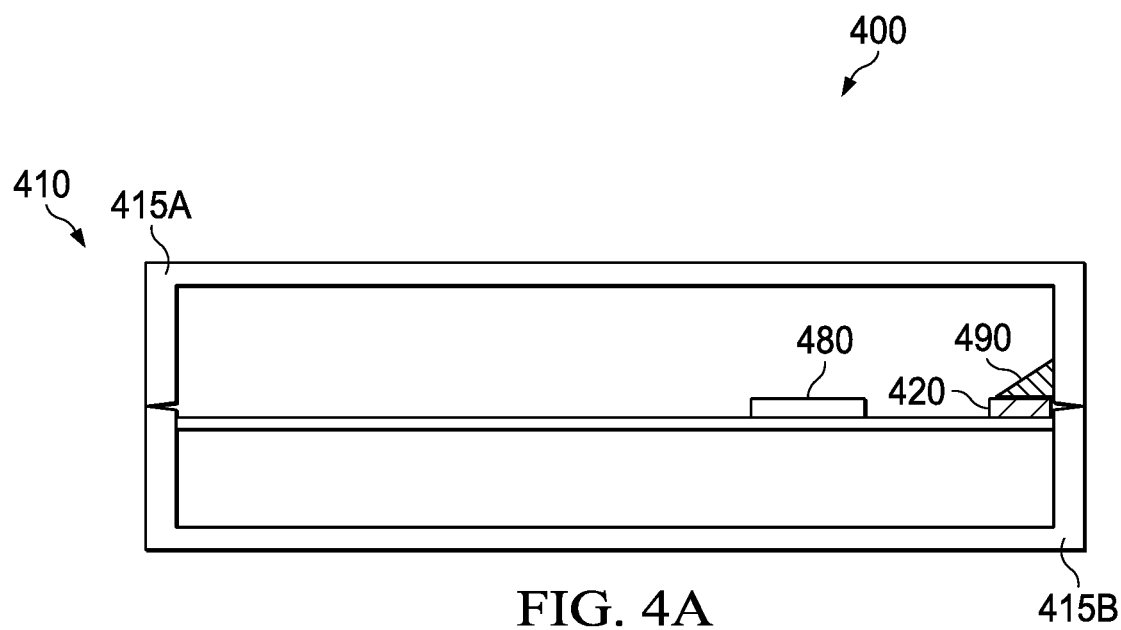
FIGS. 4A-B illustrate an example housing status detection system including a capacitive disturbance detection system.
Figure 4B:
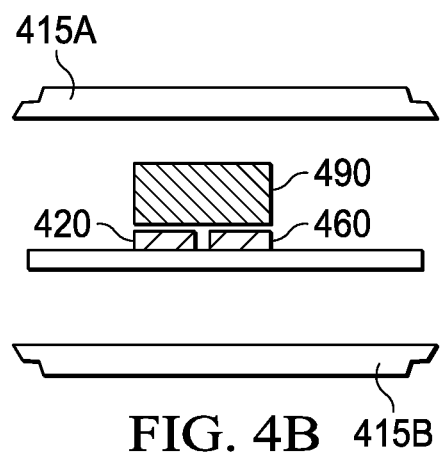

FIGS. 4A-B illustrate an example implementation for a capacitive disturbance detection system such as the one shown in FIG. 1 as a housing status detection system 400. Housing status detection system 400 can be used in a security system and is incorporated into box 410 in this example, which includes a lid 415A and a base 415B. Capacitive electrodes 420 and 460 and capacitive sensing circuit 480 are implemented on base 415B. A conductive element 490 is incorporated into lid 415A, such that in response to lid 415A being closed conductive element 490 is directly over electrodes 420 and 460 and the capacitance between electrodes 420 and 460 is greater than a threshold coupling capacitance, causing the corresponding oscillators to operate synchronously. In response to lid 415A being opened, the capacitance between electrodes 420 and 460 decreases below the threshold coupling capacitance and causes the corresponding oscillators to operate asynchronously.

Capacitive sensing system 480 determines whether lid 415A is open or closed based on whether the corresponding oscillators for electrodes 420 and 460 are operating asynchronously or synchronously, respectively. Capacitive sensing system 480 can be configured to determine the housing status of box 410 intermittently, such as at predetermined intervals or in response to a control signal, reducing the power consumption of housing status detection system 400 compared to continuously determining the housing status of box 410.

Although a box and a lid are used in this example, housing status detection system 400 can be incorporated into other kinds of housing as well, such as a door. In the example of a door, capacitive electrodes 420 and 460 can be implemented in the door frame, such as where the door latch is inserted to close the door. Conductive element 490 can be implemented in the door latch or the door handle. In response to the door being closed, conductive element 490 capacitively couples electrodes 420 and 460 together, and the corresponding relaxation oscillators oscillate synchronously. In response to the door being open, electrodes 420 and 460 are not capacitively coupled, and the corresponding relaxation oscillators oscillate asynchronously. Capacitive sensing system 480 can log the dates and times at which the door is opened or closed and flag particular dates and times at which the door is opened or closed without an expected authorization communication or the like.

Figure 5:
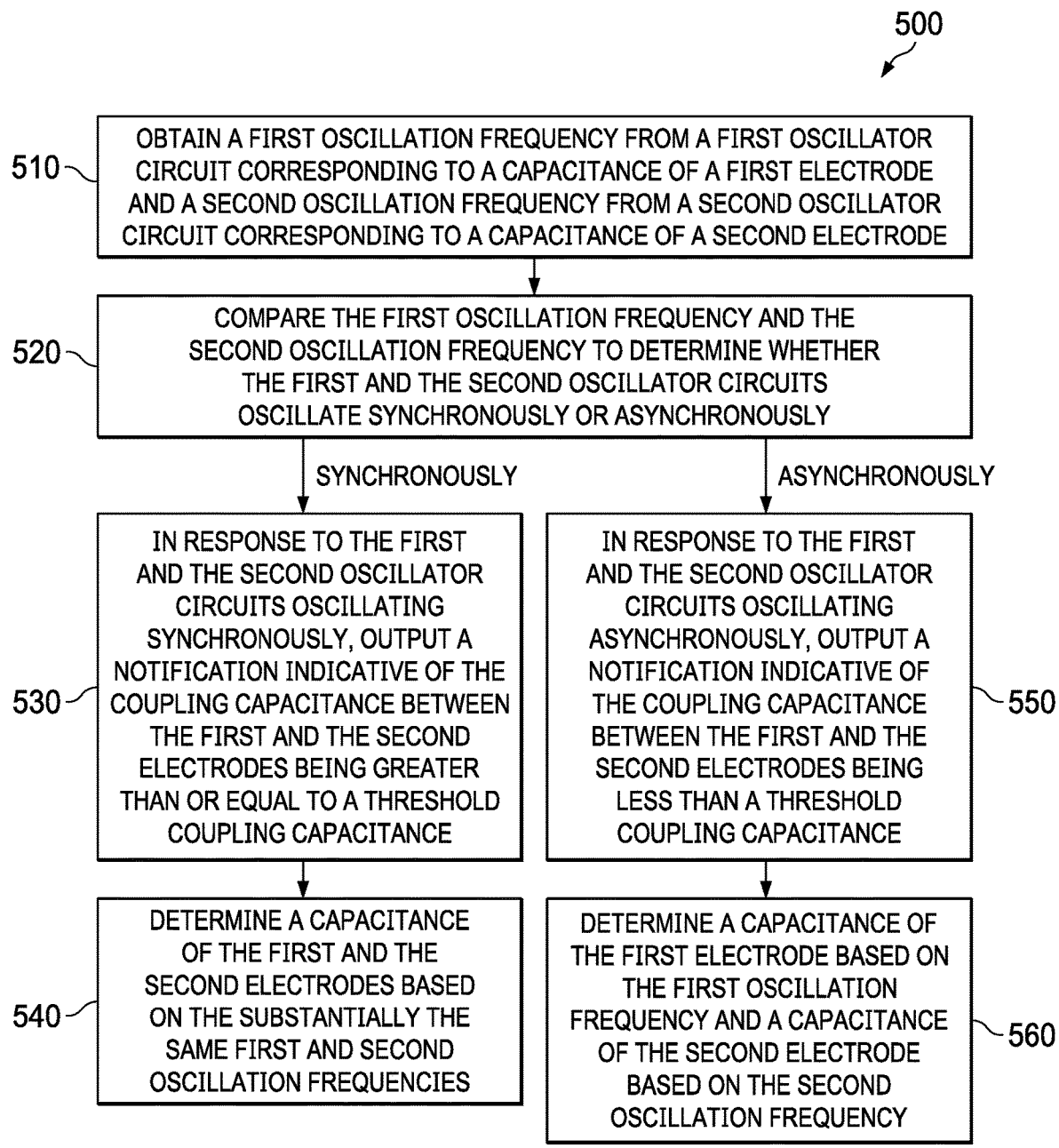
FIG. 5 illustrates, in flow chart form, an example method for detecting a disturbance to a capacitive disturbance detection system.

FIG. 5 shows, in flow chart form, an example process 500 for determining a capacitance of electrodes in a capacitive disturbance detection system such as the one shown in FIG. 1. Process 500 is performed by a processing unit executing instructions stored in a non-transitory computer readable medium, such as processing unit 185 executing instructions stored in storage 190 from capacitive disturbance detection system 100. The flow chart begins at operation 510, during which the processing unit obtains a first oscillation frequency from a first oscillator circuit corresponding to a capacitance of a first electrode, such as output 170 from oscillator circuit 130A corresponding to the capacitance 115 of electrode 120, and a second oscillation frequency from a second oscillator circuit corresponding to a capacitance of a second electrode, such as output 175 from oscillator circuit 130B corresponding to the capacitance 165 of electrode 160.

At operation 520, the processing unit compares the first oscillation frequency and the second oscillation frequency to determine whether the first and the second oscillator circuits oscillate synchronously or asynchronously. At operation 530, in response to the first and the second oscillator circuits oscillating synchronously, that is, at substantially the same frequency, the processing unit outputs a notification indicative of the coupling capacitance between the first and the second electrodes being greater than or equal to a threshold coupling capacitance, for example to display 194 or over network interface 198 to other systems. At operation 540, the processing unit determines a capacitance of the first and the second electrodes based on the substantially the same oscillating frequency for the first and the second oscillator circuits.

At operation 550, in response to the first and the second oscillator circuits oscillating asynchronously, that is, at different frequencies, the processing unit outputs a notification indicative of the coupling capacitance between the first and the second electrodes being less than the threshold coupling capacitance, for example to display 190 or over network interface 198 to other systems. At operation 560, the processing unit determines a capacitance of the first electrode based on the first oscillation frequency and a capacitance of the second electrode based on the second oscillation frequency.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

What is claimed is:

1. An apparatus, comprising:
   a first electrode having a first capacitance;
   a second electrode having a second capacitance, and disposed in proximity to the first electrode;
   a first oscillator circuit coupled to the first electrode, and configured to oscillate at a frequency inversely related to capacitance at the first electrode;
   a second oscillator circuit coupled to the second electrode, and configured to oscillate at a frequency inversely related to capacitance at the second electrode; and
   a processing unit coupled to the first and second oscillator circuits and configured to:
      determine whether the first and second oscillator circuits are oscillating synchronously or asynchronously;
      detect a change between synchronous oscillation and asynchronous oscillation of the first and second oscillator circuits; and
      responsive to detecting a change between synchronous and asynchronous oscillation, generate a control signal indicative of an external influence having changed capacitive coupling between the first electrode and the second electrode.

2. The apparatus of claim 1, further comprising a capacitor coupled to the first and the second electrodes and having a capacitance less than the threshold coupling capacitance.

3. The apparatus of claim 1, wherein the first and the second electrodes are separated by a distance, such that a disturbance within the distance increases the capacitance between the first and the second electrodes equal to or above the threshold coupling capacitance.

4. The apparatus of claim 1, wherein the processing unit generates the control signal responsive to detecting a change from asynchronous oscillation to synchronous oscillation;
   and wherein the control signal is indicative of the presence of an external influence coupling the first and second electrodes with a capacitance greater than a threshold coupling capacitance.

5. The apparatus of claim 1, wherein the processing unit generates the control signal responsive to detecting a change from synchronous oscillation to asynchronous oscillation;
   and wherein the control signal is indicative of the removal of an external influence coupling the first and second electrodes with a capacitance greater than a threshold coupling capacitance.

6. An apparatus, comprising:
   a first electrode and a second electrode;
   a first oscillator circuit coupled to the first electrode and comprising:
      a first hysteresis buffer having a first input and a first output, wherein the first input is coupled to the first electrode;
      a first inverter coupled to the first output, the first inverter having a first inverter output;
      a first selector logic circuit having a first input coupled to a supply voltage node, a second input coupled to a ground node, a selection input coupled to the first inverter output, and a first selector logic output; and
      a first resistor coupled to the first selector logic output and to the first input;
   a second oscillator circuit coupled to the second electrode, wherein the first and second oscillator circuits are configured to:

oscillate synchronously in response to a capacitance between the first and second electrodes being greater than a threshold coupling capacitance, and oscillate asynchronously in response to the capacitance between the first and second electrodes being less than a threshold coupling capacitance; and a processing unit coupled to the first and second oscillator circuits and configured to:

determine whether the first and second oscillator circuits oscillate synchronously or asynchronously; and generate a control signal indicative of a capacitive disturbance based on the determination whether the first and second oscillator circuits oscillate synchronously or asynchronously.

7. The apparatus of claim 6, wherein the first hysteresis buffer comprises a Schmitt trigger.

8. The apparatus of claim 6, wherein the second oscillator circuit comprises:

a second hysteresis buffer having a second input and a second output, wherein the second input is coupled to the second electrode;

a second inverter coupled to the second output, the second inverter having a second inverter output;

a second selector logic circuit having a third input coupled to a supply voltage node, a fourth input coupled to a ground node, a selection input coupled to the second inverter output, and a second selector logic output; and a second resistor coupled to the second selector logic output and to the second input.

9. The apparatus of claim 8, wherein the second hysteresis buffer comprises a Schmitt trigger.

10. A non-transitory computer-readable medium storing machine instructions which, when executed by one or more processing units, cause the one or more processing units to:

obtain a first oscillation frequency from a first oscillator circuit coupled to a first electrode and a second oscillation frequency from a second oscillator circuit coupled to a second electrode;

compare the first oscillation frequency and the second oscillation frequency to determine whether the first and the second oscillator circuits oscillate synchronously at substantially a same oscillation frequency or asynchronously at different oscillation frequencies; and in response to the comparing of the first and second oscillation frequencies detecting a change between synchronous oscillation and asynchronous oscillation of the first and the second oscillator circuits, output a notification indicative of an external influence having changed a capacitance between the first and the second electrodes.

11. The non-transitory computer-readable medium of claim 10, wherein the first oscillation frequency corresponds to a capacitance of the first electrode, and wherein the second oscillation frequency corresponds to a capacitance of the second electrode.

12. The non-transitory computer-readable medium of claim 11, further comprising machine instructions which, when executed by the one or more processing units, cause the one or more processing units to:

determine a capacitance of the first electrode based on the first oscillation frequency; and determine a capacitance of the second electrode based on the second oscillation frequency.

13. The non-transitory computer-readable medium of claim 10, wherein the machine instructions, when executed, cause the one or more processing units to output the notification by:

in response to detecting a change from synchronous to asynchronous oscillation of the first and the second oscillator circuits, outputting a notification indicative of reduction of the capacitance between the first and the second electrodes to less than a threshold coupling capacitance.

14. The non-transitory computer-readable medium of claim 10, wherein the machine instructions, when executed, cause the one or more processing units to output the notification by:

in response to detecting a change from asynchronous to synchronous oscillation of the first and the second oscillator circuits, outputting a notification indicative of an increase of the capacitance between the first and the second electrodes to greater than a threshold coupling capacitance.

15. The non-transitory computer-readable medium of claim 14, wherein:

the first and the second electrodes are included in a touch interface;

the first and second electrodes are capacitively coupled in response to a touch on the touch interface; and the capacitance of the first electrode and the capacitance of the second electrode vary based on a location of the touch.

16. The non-transitory computer-readable medium of claim 15, further comprising machine instructions which, when executed by the one or more processing units, cause the one or more processing units to determine the location of the touch based on the capacitance of the first electrode and the capacitance of the second electrode.

17. The non-transitory computer-readable medium of claim 15, wherein the first and the second electrodes are separated by a space, such that a touch in the space capacitively couples the first and the second electrodes.

18. A non-transitory computer-readable medium storing machine instructions which, when executed by one or more processing units, cause the one or more processing units to:

obtain a first oscillation frequency from a first oscillator circuit coupled to a first electrode and a second oscillation frequency from a second oscillator circuit coupled to a second electrode;

compare the first oscillation frequency and the second oscillation frequency to determine whether the first and the second oscillator circuits oscillate synchronously at substantially a same oscillation frequency or asynchronously at different oscillation frequencies;

in response to the first and the second oscillator circuits oscillating synchronously, output a notification indicative of a capacitance between the first and the second electrodes being equal to or greater than a threshold coupling capacitance; and in response to the first and the second oscillator circuits oscillating asynchronously, output a notification indicative of the capacitance between the first and the second electrodes being less than the threshold coupling capacitance;

wherein:

the first and the second electrodes are included in a housing status detection system;

a conductive element is included in the housing status detection system such that when a housing is closed the conductive element capacitively couples the first and the second electrodes;

the notification indicative of the first and the second electrodes being capacitively coupled comprises a notification that the housing is closed; and the notification indicative of the first and the second electrodes not being capacitively coupled comprises a notification that the housing is open.

19. A method for determining a capacitance between detecting a capacitive disturbance at a first electrode and a second electrode, comprising:
    obtaining a first oscillation frequency from a first oscillator circuit coupled to the first electrode and a second oscillation frequency from a second oscillator circuit coupled to the second electrode;
    comparing the first oscillation frequency and the second oscillation frequency to determine whether the first and the second oscillator circuits oscillate synchronously at substantially a same oscillation frequency or asynchronously at different oscillation frequencies; and
    in response to the comparing step detecting a change between synchronous oscillation and asynchronous oscillation of the first and the second oscillator circuits, outputting a notification indicative of an external influence having changed a capacitance coupled between the first and the second electrodes.

20. The method of claim 19, wherein the step of outputting a notification comprises:
    in response to detecting a change from synchronous to asynchronous oscillation of the first and the second oscillator circuits, outputting a notification indicative of reduction of the capacitance between the first and the second electrodes to less than a threshold coupling capacitance.

21. The method of claim 19, wherein the step of outputting a notification comprises:
    in response to detecting a change from asynchronous to synchronous oscillation of the first and the second oscillator circuits, outputting a notification indicative of an increase of the capacitance between the first and the second electrodes to greater than a threshold coupling capacitance.

22. The method of claim 21, wherein first and the second electrodes are included in a touch interface separated from one another so that a touch on the touch interface between and overlapping the first and second electrodes increases the capacitance between the first and the second electrodes equal to or greater than the threshold coupling capacitance.

23. The method of claim 22, further comprising determining the location of the touch based on a comparison of the first and second oscillation frequencies.

24. A method for determining a capacitance between a first electrode and a second electrode,
    obtaining a first oscillation frequency from a first oscillator circuit coupled to the first electrode and a second oscillation frequency from a second oscillator circuit coupled to the second electrode;
    comparing the first oscillation frequency and the second oscillation frequency to determine whether the first and the second oscillator circuits oscillate synchronously at substantially a same oscillation frequency or asynchronously at different oscillation frequencies;
    in response to the first and the second oscillator circuits oscillating synchronously, outputting a notification indicative of a capacitance between the first and the second electrodes being equal to or greater than a threshold coupling capacitance; and
    in response to the first and the second oscillator circuits oscillating asynchronously, outputting a notification indicative of the capacitance between the first and the second electrodes being less than the threshold coupling capacitance;
    wherein:
        the first and the second electrodes are included in a housing status detection system;
        a conductive element is included in the housing status detection system such that when a housing is closed the conductive element increases the capacitance between the first and the second electrodes equal to or greater than the threshold coupling capacitance;
        the notification indicative of the capacitance between the first and the second electrodes being equal to or greater than the threshold coupling capacitance comprises a notification that the housing is closed; and
        the notification indicative of the capacitance between the first and the second electrodes being less than the threshold coupling capacitance comprises a notification that the housing is open.

* * * * *